United States Patent [19]

Ogino et al.

[11] Patent Number: 4,665,324
[45] Date of Patent: May 12, 1987

[54] TOUCH CONTROL APPARATUS FOR ELECTRIC APPLIANCES

[75] Inventors: Yoshio Ogino, Takatsuki; Takeshi Shimomoto, Osaka; Osamu Hiraoka, Ashiya, all of Japan

[73] Assignees: Matsushita Electric Industrial Co. Ltd.; Shimomoto Technical Engineering Co., Ltd., both of Osaka; Sumitomo Metal Co., Ltd., Tokyo, all of Japan

[21] Appl. No.: 675,239

[22] Filed: Nov. 27, 1984

[30] Foreign Application Priority Data

Nov. 28, 1983 [JP]  Japan ............................... 58-223617

[51] Int. Cl.[4] ........................................ H01H 35/00
[52] U.S. Cl. .................................. 307/126; 307/116; 200/DIG. 1; 219/10.55 B; 361/320; 361/321
[58] Field of Search .............. 307/108, 112, 116, 115, 307/117, 118, 126; 200/292, DIG. 1; 361/320, 321, 322, 323; 219/10.55 B, 10.77; 340/365 C

[56] References Cited

U.S. PATENT DOCUMENTS

| | | | |
|---|---|---|---|
| 3,234,442 | 2/1966 | Maissel et al. | 361/322 X |
| 3,279,947 | 10/1966 | Kaiser | 361/320 X |
| 3,293,077 | 12/1966 | Kaiser et al. | 361/320 X |
| 3,368,919 | 2/1968 | Casale et al. | 361/322 |
| 3,495,996 | 2/1970 | Delaney et al. | 361/320 X |
| 3,582,729 | 6/1971 | Girard | 361/320 |
| 3,586,522 | 6/1971 | Hoffman | 361/320 X |
| 3,720,862 | 3/1973 | Mason | 361/320 |
| 3,900,773 | 8/1975 | Bowkley et al. | 361/320 X |
| 3,902,102 | 8/1975 | Burn | 361/321 X |
| 3,939,319 | 2/1976 | Tamano et al. | 219/10.55 B |
| 4,090,092 | 5/1978 | Serrano | 307/116 |
| 4,149,217 | 4/1979 | Tucker | 219/10.77 X |
| 4,308,443 | 12/1981 | Tucker et al. | 219/10.77 X |
| 4,322,631 | 3/1982 | Spofford | 307/39 |
| 4,380,040 | 4/1983 | Posset | 200/DIG. 1 |
| 4,446,350 | 5/1984 | Mizukawa et al. | 219/10.77 |
| 4,529,768 | 7/1985 | Hilsum et al. | 200/DIG. 1 X |
| 4,551,601 | 11/1985 | Nishimura | 219/10.55 B |

Primary Examiner—William M. Shoop, Jr.
Assistant Examiner—Shik Luen Paul Ip
Attorney, Agent, or Firm—Stevens, Davis, Miller & Mosher

[57] ABSTRACT

A touch control apparatus for an electric appliance has a plurality of conductive electrodes formed on a glass plate by heating a layer formed of a mixture of conductive powder and glass powder on a surface of the glass plate, the glass plate being used as a glass plate of an operation input section of the electric appliance. The heating produces an integral bonding of the layer and glass plate so that the control apparatus has a high mechanical strength and a long life and provides an electric appliance with a water-tight structure.

5 Claims, 5 Drawing Figures

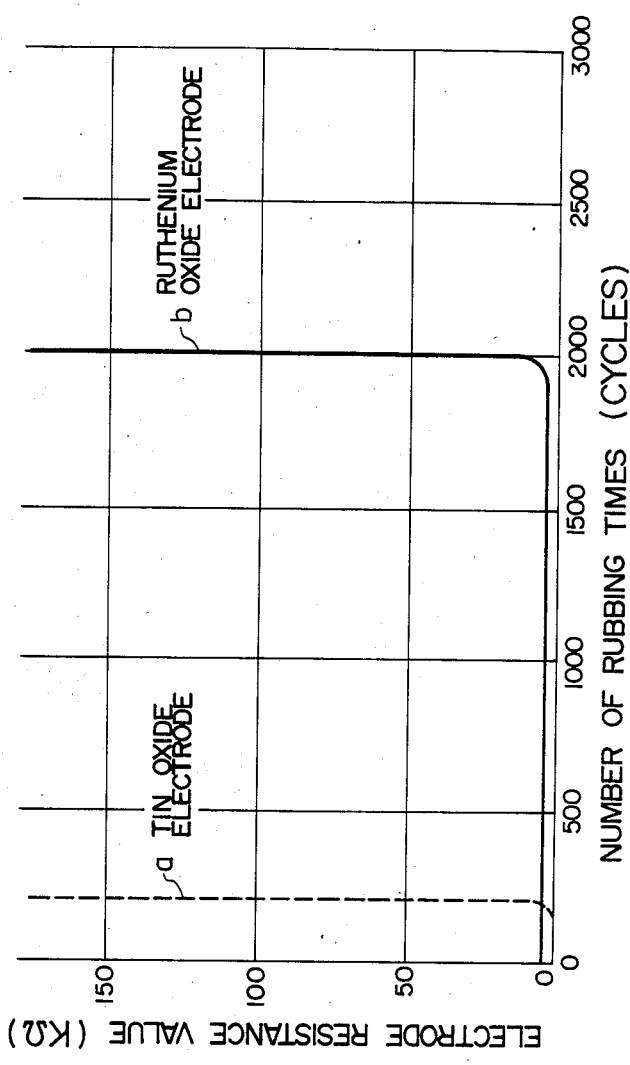

TOUCH CONTROL APPARATUS FOR ELECTRIC APPLIANCES

BACKGROUND OF THE INVENTION

1. Field of the Invention

The present invention relates to a control apparatus for electric appliances for domestic use.

2. Description of the Prior Art

Heretofore, the control apparatus for electric appliances for domestic use has been designed so that the setting and control of operating conditions of an electric appliance, such as the switching on or off of a power supply, the degree of volume, the power output level, etc., are effected by rotating or sliding a knob.

There has been a problem in the conventional control apparatus in that it is impossible to prevent the permeation of dust or water drops through an opening formed in a portion of the device through which the shaft of the knob extends and this causes a failure or misoperation of the device. There has been another problem in that the projection of a knob from the body of the device causes the breakage of a shaft of the knob by the application of any unexpected force thereto or an injury to a user.

On the other hand, the use of a membrane type switch panel or a planar switch panel having an elastic film applied onto a surface thereof has been an effective means of overcoming the foregoing deficiencies. However, since each of these planar switch panels is an elastic thin film (generally a resin sheet), it has been impossible to protect a switch portion thereof from the application of a great external force and further there has been a disadvantage that the thin film is damaged by an edge of a knife or metal and an external appearance of the thin film is spoiled or the thin film is ripped open, thereby requiring that such planar switch panels be used with care.

Further, there has been proposed a control apparatus of a touch glass type which has thin films of tin oxide or indium oxide deposited on a glass surface and in which the setting of a user is detected by detecting a hum (an induction noise) or a change in the resistance value between the conductive films caused by a touch of the hand of a user onto one of the conductive films. In this type of control apparatus, while the glass surface acts as an operating surface thereby making it possible to obtain a control apparatus having high reliability as compared with the control apparatus of the previously mentioned types, when the glass surface is rubbed (for a cleaning purpose) with a cleaning agent (e.g., a cleanser) containing polishing powder, minute scratches will still be produced on the glass surface and thereby the thin-film electrode will be cut. Moreover, there is a possibility that the thin film electrode on the touch glass is degraded chemically by an acidic or alkaline cleaning agent although having no physiological effect on the finger of the user, or by cooking juice containing a seasoning matter, etc. when the thin film electrode is used in cooking utensils. Here, it is quite possible that fat or dirt on the user's finger adheres to the glass surface when the user touches the glass surface thereby to set a cooking condition. Also, it is a usual practice to use a cleaning agent as mentioned above to wipe off the extraneous matter from the glass surface. Thus, the touch glass having a thin-film electrode deposited thereon also has a problem from the viewpoint of reliability.

SUMMARY OF THE INVENTION

It is an object of the present invention to provide a control apparatus for an electric appliance which overcomes the foregoing deficiencies of the conventional control apparatus and which provides improvement in usability and reliability.

The control apparatus of this invention has a construction such that conductive electrodes are formed by baking a layer of a mixture of conductive powder and glass powder on the surface of a glass plate and the glass plate having the conductive electrodes formed thereon is used as an input glass plate of an electric appliance. This construction prevents a failure of the conductive electrode by its being cut and/or peeled off, thereby elevating the practical value of an electric appliance which uses such a control apparatus.

BRIEF DESCRIPTION OF THE DRAWINGS

FIG. 2 is a characteristic diagram showing the durability of the conductive electrodes of a control apparatus.

DESCRIPTION OF THE PREFERRED EMBODIMENTS

An embodiment of the present invention will now be described with reference to the accompanying drawings.

Figure 1A:
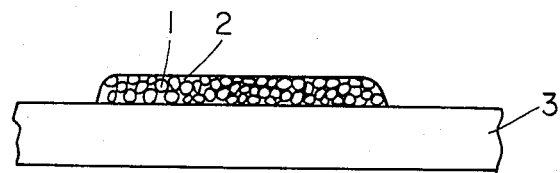
FIGS. 1A and 1B are sectional views showing respectively a construction of an electrode of the control apparatus of an embodiment of this invention before and after the baking treatment.
Figure 1B:
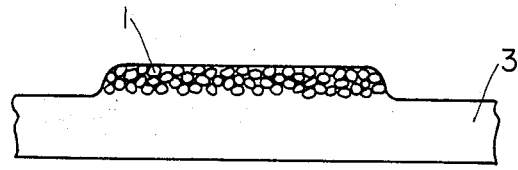

Referring to FIGS. 1A and 1B showing the construction of a glass plate of the input section of a control apparatus of an embodiment of this invention, FIG. 1A shows an electrode formed by mixing 20 to 45 parts by weight of conductive powder 1, whose typical example is barium titanate, etc., and 80 to 55 parts by weight of glass powder 2 and applying the mixture to the surface of a planar glass plate 3 in the desired form. If the content of the conductive powder 1 is insufficient, the conductivity of the electrode becomes lower than a desirable value, while, if the content of the conductive powder 1 is excessive, the content of the glass powder 2 becomes relatively insufficient with the result that the durability of the electrode is deteriorated. Thus, a PbO-$B_2O_3$-$SiO_2$ glass containing 40 to 60% by weight of PbO and 5 to 10% by weight of $B_2O_3$ and having a softening temperature of about 600° C. is a suitable material for the glass powder 2. If the softening temperature is high, the baking temperature must be raised with the resulting danger of deforming the glass plate 3, while, if it has a composition of a low softening temperature, the hardness of the electrode decreases and, as a result, the electrode becomes easily damaged.

The application of the mixture can be advantageously effected in the following manner. The conductive powder 1, the glass powder 2 and an organic vehicle are mixed together to be in a state of paste and the mixture is applied to the glass plate 3 by screen printing. The organic vehicle may suitably be prepared by dissolving an ethyl cellulose in an organic solvent such as butyl "Carbitol" acetate or terpineol. After the organic solvent has vaporized, the ethyle cellulose still remains so that it serves to bond together the powder particles thereby to maintain the shape of the applied film and simultaneously to keep the powder layer fixed to the glass plate 3. Here, when the baking is effected in air at a temperature of 500° C. or higher, almost all of the ethyl cellulose is burned and vanishes.

In this condition, the mixture is baked at the softening temperature (about 600° C.) of the glass plate 3 and the glass powder 2 and the final state of the glass plate is shown in Fig. 1B. Since the baking is effected at the softening temperature of glass, the glass powder 2 and the glass plate 3 in Fig. 1A are bonded together and they unite firmly with the conductive powder 1 contained therein. The conductive electrode formed in this way is electrically conductive, since the individual particles of the conductive powder 1 contact one another. The film of the conductive electrode may easily be formed to have thickness of 1 $\mu$ or over, and the conductive electrode can be brought into electrical contact with the finger of the user through the conductive powder 1 which is exposed to the surface of the conductive electrode, thereby making it possible to attain an input setting of an electric appliance in conjunction with a detecting circuit which will be described later.

On the other hand, the conductive metal oxide is fixed firmly and protected by the glass and therefore assuredly withstands an external force caused by friction, etc. in practical use. A result of a test of this performance is shown in FIG. 2.

FIG. 2 shows a test result obtained by rubbing the surface of a conductive electrode, which uses a ruthenium oxide as a conductive metal oxide, with a cotton cloth which contains polishing powder (cleanser) and to which a given load is applied, and comparing the durability of the ruthenium oxide electrode with that of a conventional tin oxide electrode. The durability of the ruthenium oxide electrode was about 10 times that of the tin oxide electrode. While, in this case, a ruthenium oxide, which is a conductive metal oxide, was used as the conductive powder, there is no particular limitation for a metal oxide to be used, so far as it is electrically conductive and has a softening temperature higher than that of glass.

Besides, as shown in FIG. 1B, by bonding together the glass powder 2 and the glass plate 3 at the softening temperature of glass and then rapidly cooking them, it is easy to transform the glass plate 3 into reinforced glass and thereby to obtain a glass plate for use in the input section which has high mechanical strength. Where a glass plate constitutes a part of an outer case and electrically live parts of detecting circuits, etc., which will be described later, are connected to the inner side of the glass plate, the use of a glass plate having high mechanical strength is essential to ensure safety. Thus, the use of the above-mentioned thermally reinforced glass has a great effect. Further, by using a conductive metal oxide such as a ruthenium oxide, molybdenum oxide, etc. as the conductive powder 1, it is possible to obtain a stable baked electrode.

Figure 3:
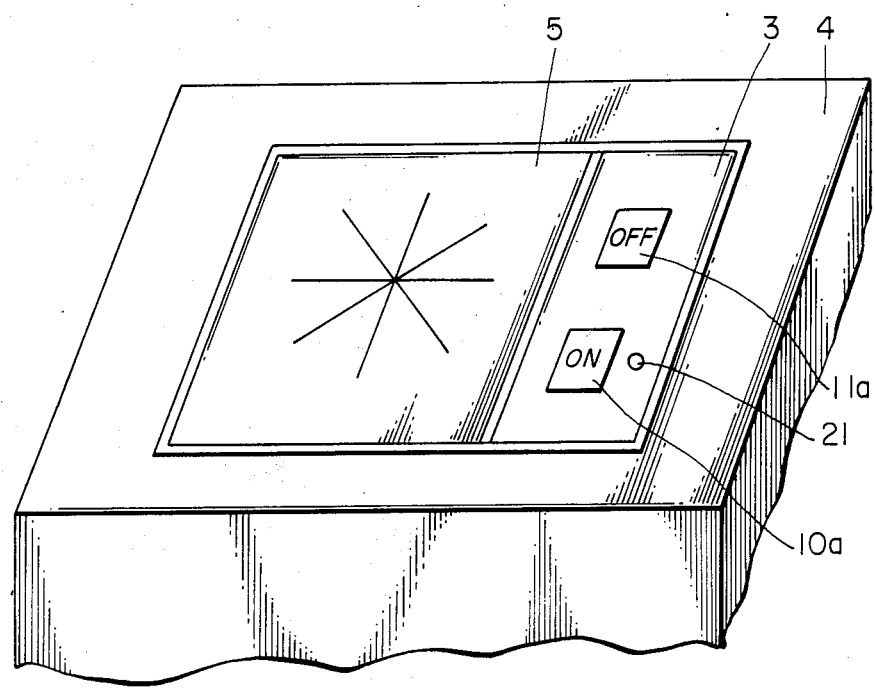
FIG. 3 is a perspective view showing an embodiment of this invention in which the control apparatus of FIG. 1 is in a product.
Figure 4:
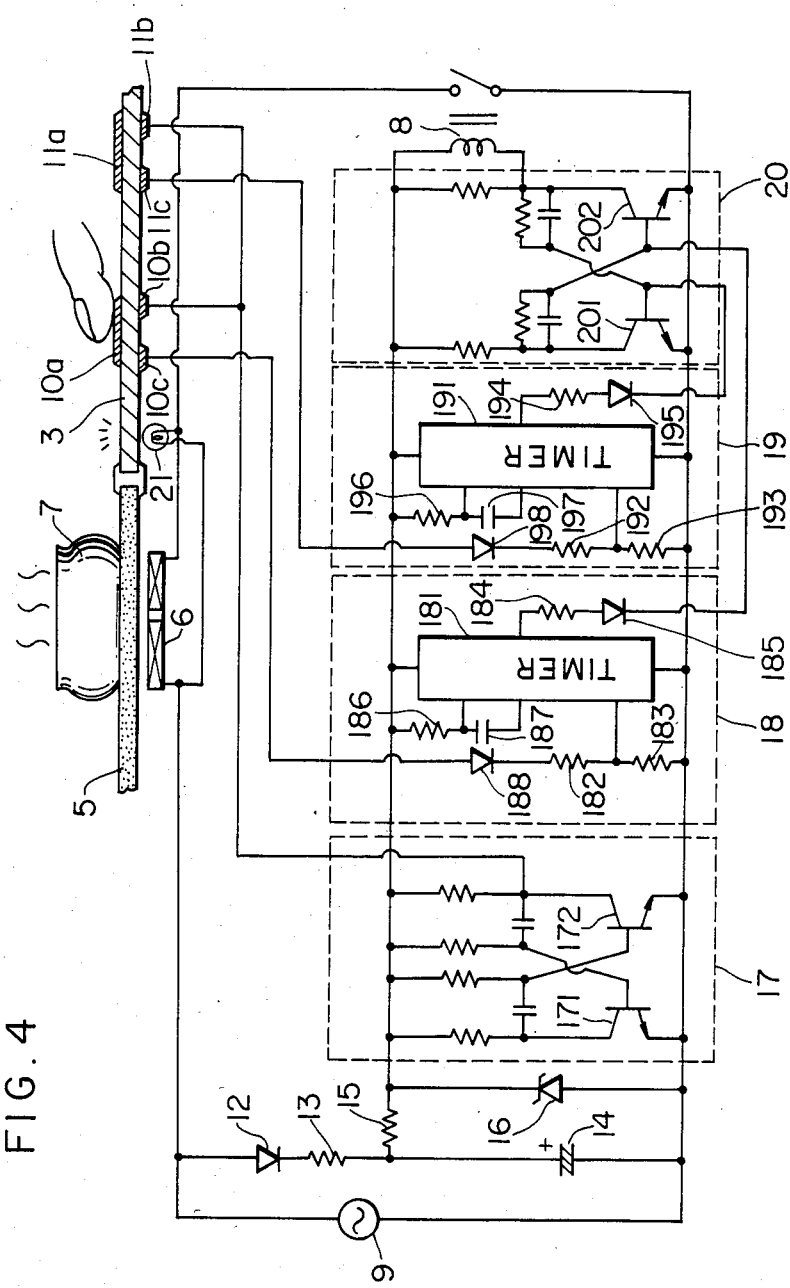
FIG. 4 is a circuit diagram showing the construction and operation of the embodiment shown in FIG. 3.

FIGS. 3 and 4 show a control apparatus of another embodiment of this invention which is incorporated in a device, that is, a control apparatus of a built-in type planar cooking utensil included in a counter or the like.

As is well known, the planar cooking utensil has a construction in which heat generated by a coil heater 6 arranged beneath a heat-resistant top plate 5 is transmitted to a cooking vessel 7 placed on the top plate 5 to perform cooking. The coil heater 6 is connected to an ac power source 9 through contact points of a relay 8.

On the other hand, first conductive electrodes 10a and 11a forming touch electrodes corresponding respectively to the switching on and off of the heater 6 are formed by being baked on the external surface of a glass plate 3 arranged to be flush with the top plate 5 and second electrodes 10b and 11b, and third electroes 10c and 11c are respectively fixed to the back surface of the glass plate 3 to be opposite to the touch electrodes. While, a baked electrode shown in FIG. 1 is used as each of the touch electrodes on the external surface of the glass plate 3, the second and third electrodes on the back surface are not exposed externally, so that the second and third electrodes may have lower strength, and hence no trouble will arise even when they are arranged by making a flexible wiring board adhere to the external surface of the glass plate 3.

A smoothing capacitor 14 is connected to the ac power source 9 through a diode 12 and a resistor 13, and a constant voltage source constituted by a resistor 15 and a Zener diode 16 is connected in parallel with the capacitor 14. A stabilized voltage across the Zener diode 16 is supplied to a driver circuit 17 which generates and supplies a square-wave signal to the second electrodes 10b and 11b, to detecting circuits 18 and 19 which are connected respectively to the third electrodes 10c and 11c to detect respective changes in the output signals therefrom, and to a flip-flop circuit 20 responsive to the output signals from the detecting circuits 18 and 19 to change its stable state.

The driver circuit 17 includes an astable multivibrator composed of two NPN transistors 171 and 172 and the square-wave signal generated at the collector of the transistor 172 is supplied to the second electrodes 10b and 11b.

Both of output signals from the third electrodes 10c and 11c are positive and negative differentiation signals of the square-wave signals applied respectively to the second electrodes 10b and 11b through static capacitances formed between the second electrode, first electrode and third electrode. When the finger of the user touches the first conductive electrode 10a, the differentiation signals bypass the detecting circuit 18 and go to ground through the human body and the output differentiation signals decrease rapidly.

In the detecting circuit 18 connected to the third electrode 10c, the above-mentioned positive and negative differentiation signals appearing at the third electrode 10c are rectified through a diode 188 and the voltage of the rectified signals is divided by resistors 182 and 183 and the divided voltage is then applied to a retriggerable timer 181 (e.g., $\mu$PD-4538 manufactured by Nippon Electric Co., Ltd). If the time constant of the timer 181 is preset to be large enough as compared with the oscillation period of the driver circuit 17 by the provision of a resistor 186 and a capacitor 187, so long as the first conductive electrode 10a is not touched, while the timer 181 is generating an output signal of a predetermined time duration, retrigger signals are successively supplied from the third electrode 10c to retrigger the timer 181 and therefore the output of the timer 181 is prevented from changing its state. On the other hand, when the first conductive electrode 10a is touched by the finger of the user, the output signals from the third electrode 10c become very small as mentioned previously, so that it is no longer possible to retrigger the timer 181 and the output of the timer 181 changes from "0" to "1" after the lapse of the time duration predetermined by the resistor 186 and the capacitor 187, whereby the timer 181 supplies its output signal to the flip-flop circuit 20 through a resistor 184 and a diode 185. On the other hand, the detecting circuit 19 corresponding to the conductive electrode 11a for switching off the heater 6 also has completely the same construction (numerals 191 to 195 correspond to numerals 181 to 185) as that of the above-mentioned detecting circuit 18 and its output is supplied to the flip-flop circuit 20 in the same manner.

The flip-flop circuit 20 comprises a bistable multivibrator formed by two NPN transistors 201 and 202, and the output of the detecting circuit 18 corresponding to the conductive electrode 10a for switching on the heater 6 is connected to the base terminal of the transistor 202 and the output of the detecting circuit 19 corresponding to the conductive electrode 11a for switching off the heater 6 is connected to the base terminal of the transistor 201. The winding of the relay 8 is connected between the cathode of the Zener diode 16 and the collector of the transistor 202. Thus, when the switching-on conductive electrode 10a is touched, the output of the detecting circuit 18 changes from "0" to "1" to render transistor 202 conductive, thereby closing the contact points of the relay 8 and supplying an electric current to the heater 6. On the contrary, when the switching-off conductive electrode 11a is touched, the output of the detecting circuit 19 changes from "0" to "1" to render transistor 201 conductive and the transistor 202 nonconductive, thereby opening the contact points of the relay 8. As a result, the supply of electric power to the heater 6 ceases. In addition, a power-on indicator lamp 21 connected across the heater 6 may be disposed beneath the glass plate 3 thereby to indicate the energization of the heater 6 by the transmitted light through the glass plate 3.

As will be seen from the foregoing description, the control apparatus of this invention having conductive electrodes formed on a glass plate by baking has sufficient strength and a long life even when it is applied to an electric appliance which is used in a horizontal position. Further, since the body of the electric appliance incorporating the control apparatus of this invention has no opening, it is easy to make the electric appliance water-tight, thereby increasing the practical value of the electric appliance using the control apparatus of this invention. While the advantages provided by the control apparatus of this invention are best suited for planar cooking utensils of the type shown in FIG. 3 and induction heating cooking utensils, the control apparatus of this invention also has advantages when applied to electric appliances, which are put to rough use in the treatment of water or dust, such as washing machines, drying machines, mixers and cleaners.

As described hereinabove, the control apparatus of this invention has the following advantages.

(1) Since conductive powder is held firmly in glass of the same material as that of a glass plate, the strength of mutual bonding between the glass plate and the electrode material is extremely high. As a result, it is possible to prevent the conductive electrode from being cut and/or peeled off even by a large external force.

(2) Since a layer of a mixture of conductive powder and glass powder is baked on the surface of a glass plate at an elevated temperature (the softening temperature of glass) to form a conductive electrode, the conductive electrode may be made extremely stable thermally and chemically.

(3) After the baking has been completed, the glass plate may be cooled rapidly and conveted easily into a reinforced glass plate, which is strong enough to withstand a mechanical external force and can prevent external exposure of the interior components.

(4) A control apparatus having no irregularity in its exterior surface can be easily obtained with the resulting enhancement of its practical value in respect of cleanability, safety, etc.

We claim:

1. A touch control apparatus for an electric appliance comprising a glass plate and at least one first conductive electrode integrally formed thereon, each said at least one first electrode being a mixture of conductive metal oxide powder and glass powder, which is formed as a layer on said glass plate and which has been heated to produce an integral bonding of said conductive metal oxide powder and glass powder within said layer and an integral bonding of said layer to said glass plate.

2. A control apparatus according to claim 1, wherein said conductive metal oxide is a ruthenium oxide.

3. A control apparaus according to claim 1, wherein said glass plate is made of reinforced glass.

4. A conrol apparatus according to claim 1, further comprising at least one second electrode formed on a back surface of said glass plate opposite to a respective conductive electrode, at least one third electrode formed on a back surface of said glass plate opposite to a respective conductive electrode, driving circuit means for supplying a square-wave drive signal to each said at least one second electrode, and detecting circuit means for detecting the magnitude of differentiation output signals from each said at least one third electrode.

5. A control apparatus according to claim 4, further comprising emans for setting an operating condition of said electric appliance in response to an output signal from said detecting circuit means.

* * * * *